United States Patent
Lee et al.

(10) Patent No.: US 9,642,260 B2
(45) Date of Patent: May 2, 2017

(54) EMBEDDED MULTILAYER CERAMIC ELECTRONIC COMPONENT AND PRINTED CIRCUIT BOARD HAVING THE SAME

(71) Applicant: SAMSUNG ELECTRO-MECHANICS CO., LTD., Suwon, Gyunggi-do (KR)

(72) Inventors: Jin Woo Lee, Gyunggi-do (KR); Hai Joon Lee, Gyunggi-do (KR); Byoung Hwa Lee, Gyunggi-do (KR); Jin Man Jung, Gyunggi-do (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 588 days.

(21) Appl. No.: 14/135,220

(22) Filed: Dec. 19, 2013

(65) Prior Publication Data
US 2015/0053472 A1    Feb. 26, 2015

(30) Foreign Application Priority Data
Aug. 26, 2013  (KR) .................. 10-2013-0100976

(51) Int. Cl.
*H01G 4/30*    (2006.01)
*H01G 4/228*   (2006.01)
(Continued)

(52) U.S. Cl.
CPC .............. *H05K 1/185* (2013.01); *H01G 2/06* (2013.01); *H01G 4/232* (2013.01); *H05K 3/3442* (2013.01); *H05K 2201/10015* (2013.01)

(58) Field of Classification Search
CPC .......... H01G 4/30; H01G 4/232; H01G 4/005; H01G 4/248; H01G 4/228
(Continued)

(56) References Cited

U.S. PATENT DOCUMENTS

| 2005/0248908 | A1 | 11/2005 | Dreezen et al. | |
| 2010/0202098 | A1* | 8/2010 | Yanagida | H01G 4/232 361/305 |
| 2012/0019981 | A1* | 1/2012 | Yoshida | H01C 1/1406 361/321.1 |

FOREIGN PATENT DOCUMENTS

| JP | 07-183154 A | 7/1995 |
| JP | 11-251204 A | 9/1999 |
| KR | 10-2006-0047733 A | 5/2006 |

\* cited by examiner

*Primary Examiner* — Eric Thomas
*Assistant Examiner* — Arun Ramaswamy
(74) *Attorney, Agent, or Firm* — McDermott Will & Emery LLP

(57) ABSTRACT

There is provided an embedded multilayer ceramic electronic component including: a ceramic body including a dielectric layer; a plurality of first and second internal electrodes; and first and second external electrodes formed on both end portions of the ceramic body, wherein the first and second external electrodes are extended to first and second main surfaces of the ceramic body, and when a thickness of the ceramic body is defined as ts, a maximum thickness of the first and second external electrodes formed on the first and second main surfaces of the ceramic body is defined as tb, a minimum distance of the first and second external electrodes formed on first and second end surfaces of the ceramic body in a length direction of the ceramic body is defined as ta, tb/ts and ta/tb satisfy the following Equations, respectively: $0.1 \leq tb/ts \leq 1.0$ and $0.5 \leq ta/tb \leq 2.0$.

14 Claims, 3 Drawing Sheets

X - X'

(51) Int. Cl.
  *H01G 4/06* (2006.01)
  *H01G 4/232* (2006.01)
  *H01G 4/005* (2006.01)
  *H01G 4/248* (2006.01)
  *H05K 1/16* (2006.01)
  *H05K 1/18* (2006.01)
  *H01G 2/06* (2006.01)
  *H05K 3/34* (2006.01)

(58) Field of Classification Search
  USPC ......... 361/321.1, 321.2, 306.1, 306.3, 301.4;
  174/260
  See application file for complete search history.

EMBEDDED MULTILAYER CERAMIC ELECTRONIC COMPONENT AND PRINTED CIRCUIT BOARD HAVING THE SAME

CROSS-REFERENCE TO RELATED APPLICATION

This application claims the benefit of Korean Patent Application No. 10-2013-0100976 filed on Aug. 26, 2013, with the Korean Intellectual Property Office, the disclosure of which is incorporated herein by reference.

BACKGROUND

The present disclosure relates to an embedded multilayer ceramic electronic component and a printed circuit board having the same.

In accordance with high density and high integration of electronic circuits, a mounting space for passive devices mounted on printed circuit boards has been insufficient. In order to solve this problem, an effort for implementing components embedded in the boards, for example, embedded devices have been conducted. Particularly, methods of embedding multilayer ceramic electronic components used as capacitive components in boards have been variously suggested.

As the method of embedding the multilayer ceramic electronic component in the board, there is a method of using a material of the board itself as a dielectric material for a multilayer ceramic electronic component and using a copper wiring, or the like, as an electrode for the multilayer ceramic electronic component. In addition, as another method of implementing an embedded multilayer ceramic electronic component, there are a method of forming a high-k polymer sheet or a dielectric thin film in the board to form the embedded multilayer ceramic electronic component, a method of embedding the multilayer ceramic electronic component in the board, and the like.

Generally, multilayer ceramic electronic components include a plurality of dielectric layers formed of a ceramic material and internal electrodes inserted between the plurality of dielectric layers. The multilayer ceramic electronic components as described above are disposed in boards, such that the embedded multilayer ceramic electronic components having high capacitance may be implemented.

In order to manufacture printed circuit boards having embedded multilayer ceramic electronic components therein, after inserting the multilayer ceramic electronic components in core boards, via holes should be punched in upper and lower multilayer plates using a laser beam in order to connect board wirings and external electrodes of the multilayer ceramic electronic components. This laser processing may be a cause of significantly increasing manufacturing costs of printed circuit boards.

Meanwhile, since the embedded multilayer ceramic electronic components should be embedded in a core portion in the boards, nickel/tin (Ni/Sn) plating layers are not required to be formed on the external electrodes, unlike general multilayer ceramic electronic components mounted on board surfaces.

For example, since the external electrode of the embedded multilayer ceramic electronic component is electrically connected to a circuit in the board through a via formed of copper (Cu), a copper (Cu) layer should be formed on the external electrode instead of forming the nickel/tin (Ni/Sn) plating layer thereon.

Generally, although external electrodes may contain copper (Cu) as a main ingredient, but glass is also contained therein, at the time of performing a laser process for forming vias in boards, ingredients contained in the glass absorb the laser beam, such that forming depths of vias may not be able to be controlled.

Therefore, copper (Cu) plating layers are separately formed on the external electrodes of the embedded multilayer ceramic electronic components.

Meanwhile, generally, external electrodes of on external electrodes in embedded multilayer ceramic electronic components are formed by applying a conductive paste for an external electrode to both end portions of ceramic bodies.

In this case, application shapes of external electrodes are not uniform, and shapes of external electrodes formed on both end surfaces of ceramic bodies are not flat, such that it may be difficult to sufficiently secure widths of the external electrodes formed on upper and lower surfaces of the ceramic bodies.

In addition, since the application shapes of the external electrodes are not uniform, it may be difficult to control thicknesses in respective regions, such that at the time of embedding the embedded multilayer ceramic electronic components in the boards, delamination defects between the embedded multilayer ceramic electronic components and the boards may occur due to deviation in the thicknesses of the external electrodes, causing deteriorate reliability.

RELATED ART DOCUMENT

Korean Patent Laid-Open Publication No. 10-2006-0047733

SUMMARY

An aspect of the present disclosure may provide an embedded multilayer ceramic electronic component and a printed circuit board having the same.

According to an aspect of the present disclosure, an embedded multilayer ceramic electronic component may include: a ceramic body including a dielectric layer and having first and second main surfaces opposing each other, first and second side surfaces opposing each other, and first and second end surfaces opposing each other; a plurality of first and second internal electrodes formed to be alternately exposed to both end surfaces of the ceramic body, having the dielectric layer therebetween; and first and second external electrodes formed on both end portions of the ceramic body, wherein the first external electrode includes a first base electrode and a first terminal electrode formed on the first base electrode, the second external electrode includes a second base electrode and a second terminal electrode formed on the second base electrode, the first and second external electrodes are extended to the first and second main surfaces of the ceramic body, and when a thickness of the ceramic body is defined as ts, a maximum thickness of the first and second external electrodes formed on the first and second main surfaces of the ceramic body is defined as tb, a minimum distance of the first and second external electrodes formed on the first and second end surfaces of the ceramic body in a length direction of the ceramic body is defined as ta, tb/ts and ta/tb satisfy $0.1 \leq tb/ts \leq 1.0$ and $0.5 \leq ta/tb \leq 2.0$, respectively.

When maximum thicknesses of the first and second external electrodes formed on the first and second main surfaces of the ceramic body are defined as tb1 and tb2, respectively, tb2/tb1 may satisfy $0.8 \leq tb2/tb1 \leq 1.25$.

When a minimum thickness of the first and second external electrodes formed on the first and second main surfaces of the ceramic body is defined as tc, tc/tb may satisfy 0.8≤tc/tb≤1.0.

The first and second terminal electrodes may be formed of copper (Cu).

When a thickness of the first and second terminal electrodes is defined as tp, tp may satisfy tp≥5 μm.

When surface roughness of the first and second terminal electrodes is defined as Ra and a thickness of the first and second terminal electrodes is defined as tp, Ra may satisfy 200 nm≤Ra≤tp.

The first and second terminal electrodes may be formed by plating.

When the thickness of the ceramic body is defined as ts, ts may satisfy ts≤100 μm.

According to another aspect of the present disclosure, a printed circuit board having an embedded multilayer ceramic electronic component, the printed circuit board may include: an insulating board; and an embedded multilayer ceramic electronic component including a ceramic body including a dielectric layer embedded in the insulating board and having first and second main surfaces opposing each other, first and second side surfaces opposing each other, and first and second end surfaces opposing each other; a plurality of first and second internal electrodes formed to be alternately exposed to both end surfaces of the ceramic body, having the dielectric layer therebetween; and first and second external electrodes formed on both end portions of the ceramic body, wherein the first external electrode includes a first base electrode and a first terminal electrode formed on the first base electrode, the second external electrode includes a second base electrode and a second terminal electrode formed on the second base electrode, the first and second external electrodes are extended to the first and second main surfaces of the ceramic body, and when a thickness of the ceramic body is defined as ts, a maximum thickness of the first and second external electrodes formed on the first and second main surfaces of the ceramic body is defined as tb, a minimum distance of the first and second external electrodes formed on the first and second end surfaces of the ceramic body in a length direction of the ceramic body is defined as ta, tb/ts and ta/tb satisfy 0.1≤tb/ts≤1.0 and 0.5≤ta/tb≤2.0, respectively.

When maximum thicknesses of the first and second external electrodes formed on the first and second main surfaces of the ceramic body are defined as tb1 and tb2, respectively, tb2/tb1 may satisfy 0.8≤tb2/tb1≤1.25.

When a minimum thickness of the first and second external electrodes formed on the first and second main surfaces of the ceramic body is defined as tc, tc/tb may satisfy 0.8≤tc/tb≤1.0.

The first and second terminal electrodes may be formed of copper (Cu).

When a thickness of the first and second terminal electrodes is defined as tp, tp may satisfy tp≥5 μm.

When surface roughness of the first and second terminal electrodes is defined as Ra and a thickness of the first and second terminal electrodes is defined as tp, Ra may satisfy 200 nm≤Ra≤tp.

The first and second terminal electrodes may be formed by plating.

When the thickness of the ceramic body is defined as ts, ts may satisfy ts≤100 μm.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
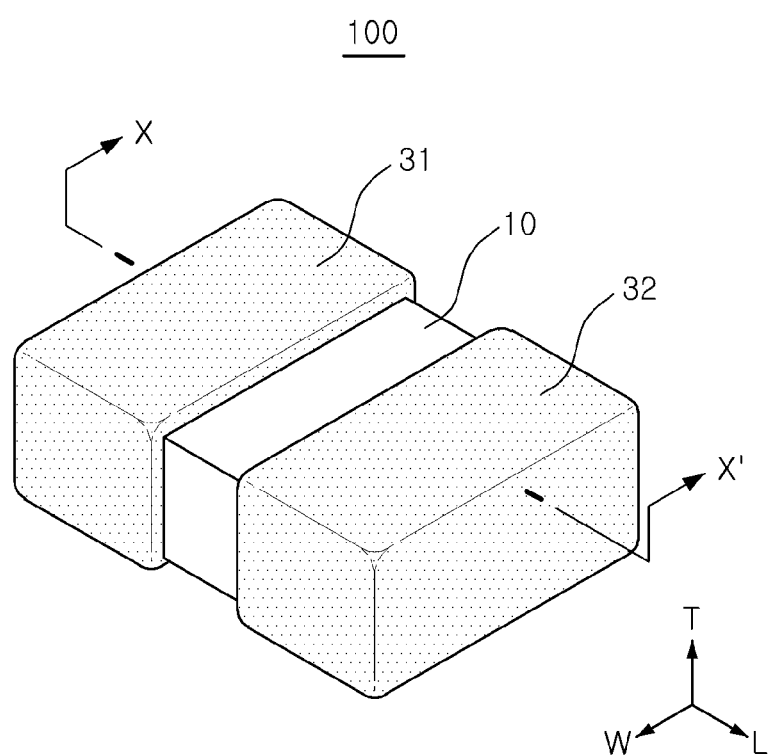
FIG. 1 is a perspective view showing an embedded multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Embedded Multilayer Ceramic Electronic Component

FIG. 1 is a perspective view showing an embedded multilayer ceramic electronic component according to an exemplary embodiment of the present disclosure.

Figure 2:
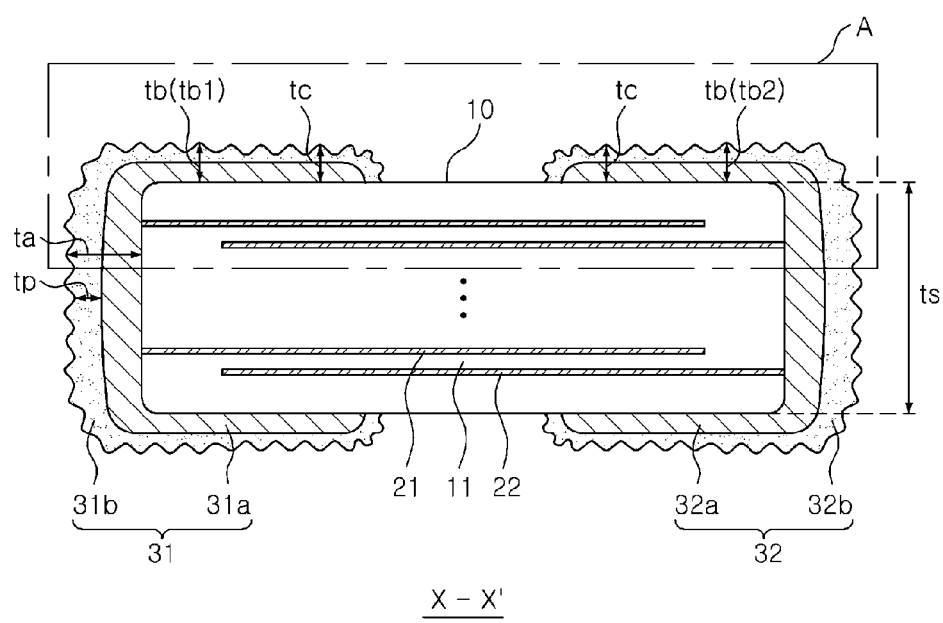
FIG. 2 is a cross-sectional view taken along line X-X' of FIG. 1.

FIG. 2 is a cross-sectional view taken along line X-X' of FIG. 1.

Figure 3:
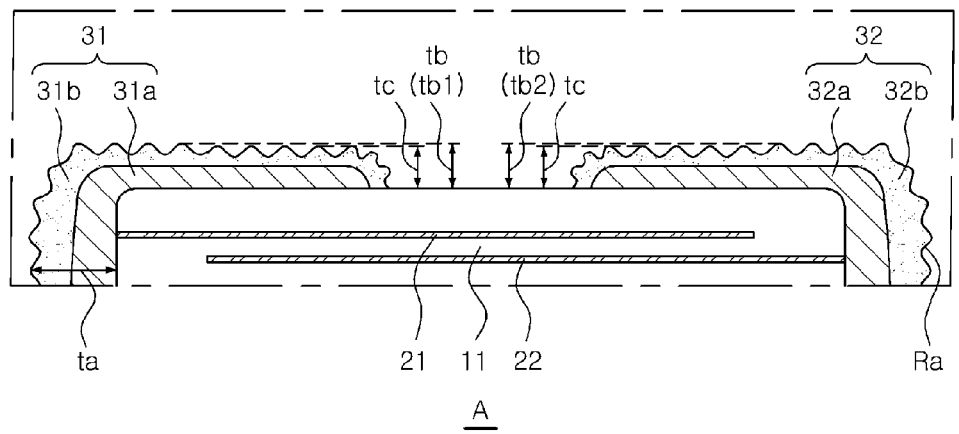
FIG. 3 is an enlarged view of part A of FIG. 2.

FIG. 3 is an enlarged view of part A of FIG. 2.

Referring to FIGS. 1 through 3, the embedded multilayer ceramic electronic component according to the exemplary embodiment of the present disclosure may include a ceramic body 10 including a dielectric layer 11 and having first and second main surfaces opposing each other, first and second side surfaces opposing each other, and first and second end surfaces opposing each other; an active layer including a plurality of first and second internal electrodes 21 and 22 formed to be alternately exposed to both end surfaces of the ceramic body 10, having the dielectric layer 11 interposed therebetween, to thereby form capacitance; upper and lower cover layers formed on upper and lower portions of the active layer; and first and second external electrodes 31 and 32 formed on both end portions of the ceramic body 10, wherein the first external electrode 31 includes a first base electrode 31a and a first terminal electrode 31b formed on the first base electrode 31a, the second external electrode 32 includes a second base electrode 32a and a second terminal electrode 32b formed on the second base electrode 32a, the first and second external electrodes 31 and 32 are extended to the first and second main surfaces of the ceramic body 10, and when a thickness of the ceramic body 10 is defined as ts, a maximum thickness of the first and second external electrodes 31 and 32 formed on the first and second main surfaces of the ceramic body 10 is defined as tb, a minimum distance of the first and second external electrodes 31 and 32 formed on the first and second end surfaces of the ceramic body 10 in a length direction of the ceramic body 10 is defined as ta, tb/ts and ta/tb may satisfy 0.1≤tb/ts≤1.0 and 0.5≤ta/tb≤2.0, respectively.

Hereinafter, the multilayer ceramic electronic component according to the exemplary embodiment of the present disclosure will be described. Particularly, a multilayer ceramic capacitor will be described, but the present disclosure is not limited thereto.

In the multilayer ceramic capacitor according to the exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' may be the same as a direction in which dielectric layers are stacked, for example, the 'stacking direction'.

In the exemplary embodiment of the present disclosure, a shape of the ceramic body 10 is not particularly limited, but may be a hexahedral shape as shown in FIG. 1.

In the exemplary embodiment of the present disclosure, the ceramic body 10 may have the first and second main surfaces opposing each other, the first and second side surfaces opposing each other, and the first and second end surfaces opposing each other, wherein the first and second main surfaces may be indicated as the upper and lower surfaces of the ceramic body 10, respectively.

The thickness ts of the ceramic body 10 may be 100 μm or less.

As described above, when the ceramic body 10 is manufactured to have a thickness ts of 100 μm or less, the multilayer ceramic capacitor may be suitable for an embedded multilayer ceramic capacitor.

In addition, the thickness ts of the ceramic body 10 may be a distance between the first and second main surfaces.

According to the exemplary embodiment of the present disclosure, a raw material forming the dielectric layer 11 is not particularly limited as long as sufficient capacitance may be obtained therefrom, but may be, for example, a barium titanate ($BaTiO_3$) powder.

In addition to the barium titanate ($BaTiO_3$) powder, or the like, various ceramic additives, organic solvents, plasticizers, binders, dispersing agents, or the like, may be added to the material forming the dielectric layer 11, as needed, according to an embodiment of the present disclosure.

An average particle size of ceramic powder used to form the dielectric layer 11 is not particularly limited and may be controlled according to an embodiment of the present disclosure, but may be controlled to be, for example, 400 nm or less.

The ceramic body 10 as described above may be configured of the active layer as a part contributing to forming capacitance of the capacitor and the upper and lower cover layers formed on the upper and lower portions of the active layer, respectively, as upper and lower margin parts.

The active layer may be formed by repeatedly stacking the plurality of first and second internal electrodes 21 and 22, having the dielectric layer 11 interposed therebetween.

The upper and lower cover layers may have the same material and configuration as those of the dielectric layer 11 except that the internal electrodes are not included therein.

The upper and lower cover layers may be formed by stacking a single dielectric layer or at least two dielectric layers on upper and lower surfaces of the active layer in a vertical direction, respectively, and generally serve to prevent the internal electrode from being damaged by physical or chemical stress.

Meanwhile, the first and second internal electrodes 21 and 22, a pair of electrodes having different polarities from each other, may be formed by printing a conductive paste containing a conductive metal on the dielectric layer 11 to a predetermined thickness.

In addition, the first and second internal electrodes 21 and 22 may be formed to be alternately exposed to both end surfaces of the ceramic body 10, in the direction in which the dielectric layers 11 are stacked, and may be electrically insulated from each other by the dielectric layer 11 disposed therebetween.

For example, the first and second internal electrodes 21 and 22 may be electrically connected to the first and second external electrodes 31 and 32 through portions thereof alternately exposed to both end surfaces of the ceramic body 10, respectively.

Therefore, when voltage is applied to the first and second external electrodes 31 and 32, electric charges are accumulated between the first and second internal electrodes 21 and 22 facing each other. In this case, capacitance of the multilayer ceramic capacitor may be in proportion to an area of an overlapped region between the first and second internal electrodes 21 and 22.

Further, the conductive metal contained in the conductive paste forming the first and second internal electrodes 21 and 22 may be nickel (Ni), copper (Cu), palladium (Pd), or an alloy thereof, but the present disclosure is not limited thereto.

In addition, as a printing method of the conductive paste, a screen printing method, a gravure printing method, or the like, may be used, but the present disclosure is not limited thereto.

According to the exemplary embodiment of the present disclosure, the external electrodes 31 and 32 may be formed on both end portions of the ceramic body 10.

The first external electrode 31 may include the first base electrode 31a electrically connected to the first internal electrode 21 and the first terminal electrode 31b formed on the first base electrode 31a.

In addition, the second external electrode 32 may include the second base electrode 32a electrically connected to the second internal electrode 22 and the second terminal electrode 32b formed on the second base electrode 32a.

Hereinafter, a structure of the first and second external electrodes 31 and 32 will be described in detail.

The first and second base electrodes 31a and 32a may contain a first conductive metal and glass.

In order to secure capacitance, the first and second external electrodes 31 and 32 may be formed on both end surfaces of the ceramic body 10, and the first and second base electrodes 31a and 32a included in the first and second external electrodes 31 and 32 may be electrically connected to the first and second internal electrodes 21 and 22.

The first and second base electrodes 31a and 32a may be formed of the same conductive material as that of the first and second internal electrodes 21 and 22, but are not limited thereto. For example, the first and second base electrodes 31a and 32a may be formed of at least one first conductive metal selected from a group consisting of copper (Cu), silver (Ag), nickel (Ni), and alloys thereof.

The first and second base electrodes 31a and 32a may be formed by applying a conductive paste prepared by adding glass frit to first conductive metal powder and then sintering the applied conductive paste.

According to the exemplary embodiment of the present disclosure, the first and second external electrodes 31 and 32 may include the first and second terminal electrodes 31b and 32b formed on the first and second base electrodes 31a and 32a.

The first and second terminal electrodes 31b and 32b may be formed of a second conductive metal.

The second conductive metal is not particularly limited, but may be, for example, copper (Cu).

Generally, since a multilayer ceramic capacitor is mounted on a printed circuit board, a nickel/tin plating layer is formed on an external electrode.

However, the multilayer ceramic capacitor according to the exemplary embodiment of the present disclosure, to be embedded in the printed circuit board, is not mounted on a board, and the first and second external electrodes 31 and 32 of the multilayer ceramic capacitor and a circuit of the board may be electrically connected to each other through a via of which a material is copper (Cu).

Therefore, according to the exemplary embodiment of the present disclosure, the first and second terminal electrodes 31b and 32b may be formed of copper (Cu) having excellent electrical connectivity with the via formed of copper (Cu) in the board.

Meanwhile, the first and second base electrodes contain copper (Cu) as a main ingredient, but glass is also contained therein, and thus, at the time of laser processing for forming the via in the board, ingredients contained in the glass may absorb a laser beam, such that a forming depth of the via may not be able to be controlled.

For this reason, the first and second terminal electrodes 31b and 32b of the embedded multilayer ceramic electronic component may be formed of copper (Cu).

A method of forming the first and second terminal electrodes 31b and 32b is not particularly limited. For example, the first and second terminal electrodes 31b and 32b may be formed by plating.

Therefore, since the first and second terminal electrodes 31b and 32b after the sintering process are only formed of copper and do not contain glass frit, a problem in that the forming depth of the via is not controlled due to absorption of the laser beam by the ingredients contained in the glass at the time of performing the laser processing for forming the via in the board does not occur.

Meanwhile, according to the exemplary embodiment of the present disclosure, the first and second external electrodes 31 and 32 may be extended to the first and second main surfaces of the ceramic body 10, and when the thickness of the ceramic body 10 is defined as ts, the maximum thickness of the first and second external electrodes 31 and 32 formed on the first and second main surfaces of the ceramic body 10 is defined as tb, the minimum distance of the first and second external electrodes 31 and 32 formed on the first and second end surfaces of the ceramic body 10 in the length direction of the ceramic body 10 is defined as ta, tb/ts and ta/tb may satisfy $0.1 \leq tb/ts \leq 1.0$ and $0.5 \leq ta/tb \leq 2.0$, respectively.

The multilayer ceramic capacitor having excellent reliability may be implemented by controlling a ratio (tb/ts) of the maximum thickness tb of the first and second external electrodes 31 and 32 formed on the first and second main surfaces of the ceramic body 10 to the thickness ts of the ceramic body 10 so as to satisfy $0.1 \leq tb/ts \leq 1.0$.

In the case in which the ratio (tb/ts) of the maximum thickness tb of the first and second external electrodes 31 and 32 formed on the first and second main surfaces of the ceramic body 10 to the thickness ts of the ceramic body 10 is less than 0.1, there may be a problem in the reliability due to infiltration of a plating solution or a moisture-resistance defect.

In the case in which the ratio (tb/ts) of the maximum thickness tb of the first and second external electrodes 31 and 32 formed on the first and second main surfaces of the ceramic body 10 to the thickness ts of the ceramic body 10 is more than 1.0, the reliability may be deteriorated due to defects such as occurrence of delamination.

In addition, the multilayer ceramic capacitor having excellent reliability may be implemented by controlling a ratio (ta/tb) of the minimum distance ta of the first and second external electrodes 31 and 32 formed on the first and second end surfaces of the ceramic body 10 in the length direction of the ceramic body 10 to the maximum thickness tb of the first and second external electrodes 31 and 32 formed on the first and second main surfaces of the ceramic body 10 so as to satisfy $0.5 \leq ta/tb \leq 2.0$.

In the case in which the ratio (ta/tb) of the minimum distance ta of the first and second external electrodes 31 and 32 formed on the first and second end surfaces of the ceramic body 10 in the length direction of the ceramic body 10 to the maximum thickness tb of the first and second external electrodes 31 and 32 formed on the first and second main surfaces of the ceramic body 10 is less than 0.5, there may be a problem in the reliability due to infiltration of a plating solution or a moisture-resistance defect.

In the case in which the ratio (ta/tb) of the minimum distance ta of the first and second external electrodes 31 and 32 formed on the first and second end surfaces of the ceramic body 10 in the length direction of the ceramic body 10 to the maximum thickness tb of the first and second external electrodes 31 and 32 formed on the first and second main surfaces of the ceramic body 10 is more than 2.0, the delamination defects may be generated, or the reliability may be deteriorated due to an electrode delamination defect.

Meanwhile, when maximum thicknesses of the first and second external electrodes 31 and 32 formed on the first and second main surfaces of the ceramic body 10 are defined as tb1 and tb2, respectively, tb2/tb1 may satisfy $0.8 \leq tb2/tb1 \leq 1.25$.

At the time of embedding the multilayer ceramic capacitor in the board, delamination defects in the board may be decreased by controlling a ratio (tb2/tb1) between the maximum thicknesses tb1 and tb2 of the first and second external electrodes 31 and 32 formed on the first and second main surfaces of the ceramic body 10, respectively, so as to satisfy $0.8 \leq tb2/tb1 \leq 1.25$.

For example, a deviation in the thickness between the first and second external electrodes may be decreased by controlling the ratio (tb2/tb1) between the maximum thicknesses tb1 and tb2 of the first and second external electrodes 31 and 32 formed on the first and second main surfaces of the ceramic body 10 so as to be approximately close to 1.0.

Therefore, a contact area between the multilayer ceramic capacitor and the board may be increased, such that delamination defects in the board may be decreased.

In the case in which the ratio (tb2/tb1) between the maximum thicknesses tb1 and tb2 of the first and second external electrodes 31 and 32 formed on the first and second main surfaces of the ceramic body 10, respectively, is less than 0.8, or more than 1.25, at the time of embedding the multilayer ceramic capacitor in the board, delamination defects in the board may occur.

Meanwhile, when a minimum thickness of the first and second external electrodes 31 and 32 formed on the first and second main surfaces of the ceramic body 10 is defined as tc, tc/tb may satisfy $0.8 \leq tc/tb \leq 1.0$.

At the time of embedding the multilayer ceramic capacitor in the board, delamination defects in the board may be decreased by controlling a ratio (tc/tb) of the minimum thickness tc of the first and second external electrodes 31 and 32 formed on the first and second main surfaces of the ceramic body 10 to the maximum thickness tb of the first and second external electrodes 31 and 32 formed on the first and second main surfaces of the ceramic body 10 so as to satisfy 0.8≤tc/tb≤1.0.

In the case of a general multilayer ceramic capacitor, in the case of applying a conductive paste for an external electrode to a ceramic body in a process of forming the external electrode, a deviation in thickness in the respective regions may occur due to viscosity of the conductive paste.

As described above, the deviation in thickness according to a respective region of the external electrodes may occur, such that a contact area with the board may be decreased. In this case, at the time of embedding the general multilayer ceramic capacitor in a board, delamination defects may frequently occur.

However, according to the exemplary embodiment of the present disclosure, the ratio (tc/tb) of the minimum thickness tc of the first and second external electrodes 31 and 32 formed on the first and second main surfaces of the ceramic body 10 to the maximum thickness tb of the first and second external electrodes 31 and 32 formed on the first and second main surfaces of the ceramic body 10 is controlled to be approximately close to 1, such that the deviation in thickness according to the respective region of the external electrodes may be decreased.

Therefore, the contact area between the multilayer ceramic capacitor and the board may be increased, such that the electrode delamination defects in the board may be decreased.

In the case in which the ratio (tc/tb) of the minimum thickness tc to the maximum thickness tb of the first and second external electrodes 31 and 32 formed on the first and second main surfaces of the ceramic body 10 is less than 0.8, at the time of embedding the multilayer ceramic capacitor in the board, delamination defects in the board may occur.

The controlling of the ratio (tc/tb) of the minimum thickness tc to the maximum thickness tb of the first and second external electrodes 31 and 32 formed on the first and second main surfaces of the ceramic body 10 so as to be in a range of 0.8 to 1.0 (0.8≤tc/tb≤1.0) may be implemented by a secondary applying method in the process of forming the external electrode unlike the case according to the related art, and a detailed description thereof will be described below.

Meanwhile, when a thickness of the first and second terminal electrodes 31b and 32b is defined as tp, tp may be 5 μm or more.

The thickness tp of the first and second terminal electrodes 31b and 32b may be 5 μm or more, but is not limited thereto. The thickness tp of the first and second terminal electrodes 31b and 32b may be 15 μm or less.

As described above, the thickness tp of the first and second terminal electrodes 31b and 32b is controlled to be in a range of 5 to 15 (5 μm≤tp≤15 μm), such that the multilayer ceramic capacitor having an excellently processed via in the board and excellent reliability may be implemented.

In the case in which the thickness tp of the first and second terminal electrodes 31b and 32b is less than 5 μm, there is a problem in that when the multilayer ceramic electronic component is embedded in the printed circuit board as described below, at the time of processing a conductive via hole, the conductive via hole may be connected to the ceramic body 10.

In the case in which the thickness tp of the first and second terminal electrodes 31b and 32b is more than 15 μm, cracks may be generated in the ceramic body 10 by stress of the first and second terminal electrodes 31b and 32b.

Meanwhile, referring to FIG. 3, in the multilayer ceramic electronic component according to the exemplary embodiment of the present disclosure, when surface roughness and the thickness of the first and second terminal electrodes 31b and 32b are defined as Ra and tp, respectively, Ra may satisfy 200 nm≤Ra≤tp.

The delamination phenomenon between the multilayer ceramic electronic component and the board may be decreased, and the occurrence of cracks may be prevented by controlling the surface roughness Ra of the first and second terminal electrodes 31b and 32b so as to satisfy 200 nm≤Ra≤tp.

The surface roughness indicates a degree of fine unevenness generated on a surface at the time of processing a metal surface.

The surface roughness is generated by tools used in processing, suitability of a processing method, scratch generated in a surface, rust, or the like. In indicating the degree of roughness, in the case of perpendicularly cutting the surface and observing a cross section thereof, a certain curve is observed, and a height between a lowest point of the curve and a highest point of the curve may be defined as center line average roughness and represented by Ra.

In the present disclosure, the center line average roughness of the first and second terminal electrodes 31b and 32b may be defined as Ra.

In detail, as a method of calculating the center line average roughness Ra of the first and second terminal electrodes 31b and 32b is as follows. A virtual center line may be drawn with respect to roughness formed on one surface of the first and second terminal electrodes 31b and 32b.

Then, the center line average roughness Ra of the first and second terminal electrodes 31b and 32b may be calculated by measuring respective distances (for example, $r_1$, $r_2$, $r_3$ ... $r_{13}$) based on the virtual center line of the roughness and then calculating an average value of the respective distance according to the following Equation.

$$R_a = \frac{|r_1| + |r_2| + |r_3| + \ldots |r_n|}{n}$$

A multilayer ceramic electronic component having an excellent withstand voltage property and excellent reliability due to improved adhesive force between the multilayer ceramic electronic component and the board may be implemented by controlling the center line average roughness Ra of the first and second terminal electrodes 31b and 32b so as to satisfy 200 nm≤Ra≤tp.

In the case in which the surface roughness of the first and second terminal electrodes 31b and 32b is less than 200 nm, the delamination phenomenon may be generated between the multilayer ceramic electronic component and the board.

Meanwhile, in the case in which the surface roughness of the first and second terminal electrodes 31b and 32b is more than the thickness tp of the first and second terminal electrodes 31b and 32b, cracks may be generated.

Hereinafter, a method of manufacturing an embedded multilayer ceramic electronic component according to the exemplary embodiment of the present disclosure will be described, but the present disclosure is not limited thereto.

In the method of manufacturing an embedded multilayer ceramic electronic component according to the exemplary embodiment of the present disclosure, first, a slurry containing powder such as a barium titanate ($BaTiO_3$) powder, or the like, may be applied to a carrier film to then be dried thereon so as to prepare a plurality of ceramic green sheets, thereby forming dielectric layers.

The ceramic green sheet may be manufactured by mixing a ceramic powder, a binder, and a solvent to prepare the slurry and manufacturing the prepared slurry as a sheet having a thickness of several μm by a doctor blade method.

Next, a conductive paste for an internal electrode in which an average size of nickel particles is 0.1 to 0.2 μm and 40 to 50 parts by weight of nickel powder is contained may be prepared.

After an internal electrode is formed by applying the conductive paste for an internal electrode to the green sheet by a screen printing method, 400 to 500 green sheets may be stacked, thereby manufacturing a ceramic body 10.

In the multilayer ceramic capacitor according to the exemplary embodiment of the present disclosure, the first and second internal electrodes 21 and 22 may be formed to be exposed to both end surfaces of the ceramic body 10, respectively.

Next, the first and second base electrodes containing a first conductive metal and glass may be formed on end portions of the ceramic body 10.

The first conductive metal is not particularly limited, but may be, for example, at least one selected from a group consisting of copper (Cu), silver (Ag), nickel (Ni), and alloys thereof.

The glass is not particularly limited, but may be a material having the same composition as that of glass used to manufacture an external electrode of a general multilayer ceramic capacitor.

The first and second base electrodes may be formed on the end portions of the ceramic body so as to be electrically connected to the first and second internal electrodes, respectively.

The first and second base electrodes may be formed by applying a conductive paste for an external electrode containing the first conductive metal and glass to the end portions of the ceramic body.

In this case, the applying may be performed using the secondary applying method as described above in order to control a ratio (tc/tb) of the minimum thickness tc to the maximum thickness tb of the first and second external electrodes 31 and 32 formed on the first and second main surfaces of the ceramic body 10 so as to satisfy 0.8≤tc/tb≤1.0.

In detail, unlike a general process of applying a paste to an end portion of a ceramic body to then be dried and sintered thereon, after the paste is primarily applied, an external electrode paste formed on the end surface of the ceramic body is subjected to a blotting and drying process. Then, the paste is secondarily applied and then re-subjected to the blotting and drying process, such that the external electrode satisfying the above-mentioned condition may be implemented.

Next, a plating layer formed of a second conductive metal may be formed on the first and second base electrodes.

The second conductive metal is not particularly limited, but may be, for example, copper (Cu).

The plating layer may be formed as first and second terminal electrodes.

Other features overlapped with those of the above-mentioned embedded multilayer ceramic electronic component according to the foregoing exemplary embodiment of the present disclosure will be omitted.

Hereafter, although the present disclosure will be described in detail with reference to Embodiment examples, the present disclosure is not limited thereto.

In an embedded multilayer ceramic electronic component according to the exemplary embodiment of the present disclosure, delamination defects, electrode delamination defects, reliability against moisture load, and reliability against high temperature load according to a ratio (ta/tb) of a minimum distance to of first and second external electrodes formed on the first and second end surfaces of a ceramic body in a length direction of the ceramic body, to a maximum thickness tb of the first and second external electrodes formed on first and second main surfaces of the ceramic body, and the ratio (tb/ts) of the maximum thickness tb of the first and second external electrodes formed on the first and second main surfaces of the ceramic body to a thickness ts of the ceramic body were observed.

The delamination defects may indicate delamination defects occurring between the embedded multilayer ceramic electronic component and an adhesive surface, and the electrode delamination defects may indicate delamination defects occurring between the external electrode and the surface of the ceramic body.

Examination on the reliability against moisture load was performed under conditions of a temperature of 85° C., relative humidity of 85%, 1 Vr, and 1 hour.

Examination on the reliability against high temperature load was performed in 3 steps, for example, a first step under conditions of a temperature of 85° C., 1 Vr, and 1 hour, a second step under conditions of a temperature of 85° C., 2 Vr, and 1 hour, and a third step under conditions of a temperature of 105° C., 2 Vr, and 1 hour.

In addition, the generation frequency of adhesive surface delamination according to the ratio (tb2/tb1) between maximum thicknesses tb1 and tb2 of the first and second external electrodes formed on the first and second main surfaces of the ceramic body, respectively, was examined.

In addition, the generation frequency of adhesive surface delamination according to the ratio (tc/tb) of the minimum thickness tc to the maximum thickness tb of the first and second external electrodes formed on the first and second main surfaces of the ceramic body was examined.

Further, in order to confirm whether or not a via processing defect was generated according to the thicknesses of the first and second terminal electrodes 31b and 32b and the generation frequency of adhesive surface delamination according to the surface roughness of the first and second terminal electrodes 31b and 32b, after a board having the multilayer ceramic electronic component embedded therein was left under conditions of a temperature of 85° C. and relative humidity of 85% for 30 minutes, which were general conditions of a chip component for a mobile phone mother board, examination was performed through the respective experiment.

The delamination defect, the electrode delamination defect, the reliability against moisture load, and the reliability against high temperature load according to the ratio (ta/tb) of the minimum distance to of the first and second external electrodes formed on the first and second end surfaces of the ceramic body in the length direction of the ceramic body to the maximum thickness tb of the first and second external electrodes formed on first and second main surfaces of the ceramic body, and the ratio (tb/ts) of the maximum thickness tb of the first and second external electrodes formed on the first and second main surfaces of the ceramic body to the thickness ts of the ceramic body are illustrated in the following Table 1.

TABLE 1

| Sample | Thickness of ceramic body (μm) | ta/tb | tb/ts | Adhesive surface delamination | Electrode delamination | Reliability against moisture load | Reliability against high temperature load |
|---|---|---|---|---|---|---|---|
| *1  | 100 | 0.25 | 0.05 | 0/200  | 0/200  | X | X |
| *2  |     |      | 0.1  | 0/200  | 0/200  | X | X |
| *3  |     |      | 0.5  | 0/200  | 0/200  | X | X |
| *4  |     |      | 1.0  | 0/200  | 0/200  | X | X |
| *5  |     |      | 1.2  | 0/200  | 0/200  | X | X |
| *6  |     | 0.5  | 0.05 | 0/200  | 0/200  | X | X |
| 7   |     |      | 0.1  | 0/200  | 0/200  | ○ | ○ |
| 8   |     |      | 0.5  | 0/200  | 0/200  | ○ | ○ |
| 9   |     |      | 1.0  | 0/200  | 0/200  | ○ | ○ |
| *10 |     |      | 1.2  | 2/200  | 0/200  | ○ | ○ |
| *11 |     | 1.0  | 0.05 | 0/200  | 0/200  | X | X |
| 12  |     |      | 0.1  | 0/200  | 0/200  | ○ | ○ |
| 13  |     |      | 0.5  | 0/200  | 0/200  | ○ | ○ |
| 14  |     |      | 1.0  | 0/200  | 0/200  | ○ | ○ |
| *15 |     |      | 1.2  | 3/200  | 0/200  | ○ | ○ |
| *16 |     | 2.0  | 0.05 | 0/200  | 0/200  | X | X |
| 17  |     |      | 0.1  | 0/200  | 0/200  | ○ | ○ |
| 18  |     |      | 0.5  | 0/200  | 0/200  | ○ | ○ |
| 19  |     |      | 1.0  | 0/200  | 0/200  | ○ | ○ |
| *20 |     |      | 1.2  | 7/200  | 0/200  | ○ | ○ |
| *21 |     | 2.5  | 0.05 | 0/200  | 0/200  | X | X |
| *22 |     |      | 0.1  | 0/200  | 5/200  | ○ | ○ |
| *23 |     |      | 0.5  | 0/200  | 16/200 | ○ | ○ |
| *24 |     |      | 1.0  | 0/200  | 22/200 | ○ | ○ |
| *25 |     |      | 1.2  | 20/200 | 39/200 | ○ | ○ |
| *26 |     | 3.0  | 0.05 | 14/200 | 13/200 | X | X |
| *27 |     |      | 0.1  | 17/200 | 17/200 | ○ | ○ |
| *28 |     |      | 0.5  | 26/200 | 26/200 | ○ | ○ |
| *29 |     |      | 1.0  | 32/200 | 40/200 | ○ | ○ |
| *30 |     |      | 1.2  | 47/200 | 59/200 | ○ | ○ |

*Comparative Example
X: Defect rate of 10% or more
○: Defect rate less than 10%

Referring to Table 1, it may be appreciated that in the case in which the ratio (ta/tb) of the minimum distance to of the first and second external electrodes formed on the first and second end surfaces of the ceramic body in the length direction of the ceramic body to the maximum thickness tb of the first and second external electrodes formed on first and second main surfaces of the ceramic body was in a range of 0.5 to 2.0 (0.5≤ta/tb≤2.0) and the ratio (tb/ts) of the maximum thickness tb of the first and second external electrodes formed on the first and second main surfaces of the ceramic body to the thickness ts of the ceramic body was in a range of 0.1 to 1.0 (0.1≤tb/ts≤1.0), the adhesive surface delamination defects and the electrode delamination defects did not occur, and the reliability against moisture load and the reliability against high temperature load were excellent.

On the other hand, it may be appreciated that in the case in which the to/tb and tb/ts were outside of the above-mentioned numerical range, the adhesive surface delamination defects or the electrode delamination defects occurred, or there was a problem in the reliability against moisture load or the reliability against high temperature load.

The generation frequency of the delamination of the adhesive surface according to the ratio (tb2/tb1) between maximum thicknesses tb1 and tb2 of the first and second external electrodes formed on the first and second main surfaces of the ceramic body, respectively, is illustrated in the following Table 2.

TABLE 2

| Sample | tb2/tb1 | Adhesive surface delamination |
|---|---|---|
| *1  | 0.6  | 12/200 |
| *2  | 0.7  | 6/200  |
| *3  | 0.75 | 4/200  |
| 4   | 0.8  | 0/200  |
| 5   | 0.9  | 0/200  |
| 6   | 1.0  | 0/200  |
| 7   | 1.1  | 0/200  |
| 8   | 1.2  | 0/200  |
| 9   | 1.25 | 0/200  |
| *10 | 1.3  | 7/200  |
| *11 | 1.4  | 11/200 |

*Comparative Example

Referring to Table 2, it may be appreciated that in the case in which the ratio (tb2/tb1) between the maximum thicknesses tb1 and tb2 of the first and second external electrodes 31 and 32 formed on the first and second main surfaces of the ceramic body, respectively, is in a range of 0.8 to 1.25 (0.8≤tb2/tb1≤1.25), the adhesive surface delamination defects do not occur, such that the reliability is relatively excellent.

On the other hand, it may be appreciated that in the case in which tb2/tb1 is outside of the above-mentioned numerical range, the adhesive surface delamination defects occur, such that there is a problem in terms of reliability.

The generation frequency of the adhesive surface delamination according to the ratio (tc/tb) of the minimum thickness tc to the maximum thickness tb of the first and second external electrodes formed on the first and second main surfaces of the ceramic body is illustrated in the following Table 3.

TABLE 3

| Sample | tb2/tb1 | Adhesive surface delamination |
|---|---|---|
| *1 | 0.6 | 11/200 |
| *2 | 0.7 | 7/200 |
| 3 | 0.8 | 0/200 |
| 4 | 0.9 | 0/200 |
| 5 | 1.0 | 0/200 |

*Comparative Example

Referring to Table 3, it may be appreciated that in the case in which the ratio (tc/tb) of the minimum thickness tc to the maximum thickness tb of the first and second external electrodes formed on the first and second main surfaces of the ceramic body is in a range of 0.8 to 1.0 ($0.8 \leq tc/tb \leq 1.0$), the adhesive surface delamination defect does not occur, such that the reliability is relatively excellent.

On the other hand, it may be appreciated that in the case in which tc/tb is less than 0.8, the adhesive surface delamination defect occurs, such that there is a problem in terms of reliability.

Whether or not the via processing defect occurs according to the thickness of the first and second terminal electrodes 31b and 32b is illustrated in the following Table 4.

TABLE 4

| Thickness of first and second terminal electrodes (μm) | Determination |
|---|---|
| Less than 1 | X |
| 1~2 | X |
| 2~3 | X |
| 3~4 | Δ |
| 4~5 | ○ |
| 5~6 | ⊚ |
| 6 or more | ⊚ |

X: Defect rate 50% or more
Δ: Defect rate of 10 to 50%
○: Defect rate of 0.01 to 10%
⊚: Defect rate less than 0.01%

Referring to Table 4, it may be appreciated that in the case in which the thickness of the first and second terminal electrodes 31b and 32b is 5 μm or more, the multilayer ceramic capacitor having an excellently processed via in the board and excellent reliability may be implemented.

On the other hand, it may be appreciated that in the case in which the thickness of the first and second terminal electrodes 31b and 32b is less than 5 μm, at the time of processing the via in the board, a defect may be generated.

The generation frequency of the adhesive surface delamination defect according to the surface roughness of the first and second terminal electrodes 31b and 32b is illustrated in the following Table 5.

TABLE 5

| Surface roughness of first and second terminal electrode (nm) | Determination |
|---|---|
| Less than 50 | X |
| 50~100 | X |
| 100~150 | Δ |
| 150~200 | ○ |
| 200~250 | ⊚ |
| 250 or more | ⊚ |

X: Defect rate of 50% or more
Δ: Defect rate of 10 to 50%
○: Defect rate of 0.01 to 10%
⊚: Defect rate less than 0.01%

Referring to Table 5, it may be appreciated that in the case in which the surface roughness of the first and second terminal electrodes 31b and 32b is 200 nm or more, the generation frequency of the adhesive surface delamination is relatively low, such that the multilayer ceramic capacitor having excellent reliability may be implemented.

On the other hand, it may be appreciated that in the case in which the surface roughness of the first and second terminal electrodes 31b and 32b is less than 200 nm, the generation frequency of the adhesive surface delamination is increased, such that there is a problem in terms of reliability.

Printed Circuit Board Having Embedded Multilayer Ceramic Electronic Component

Figure 4:
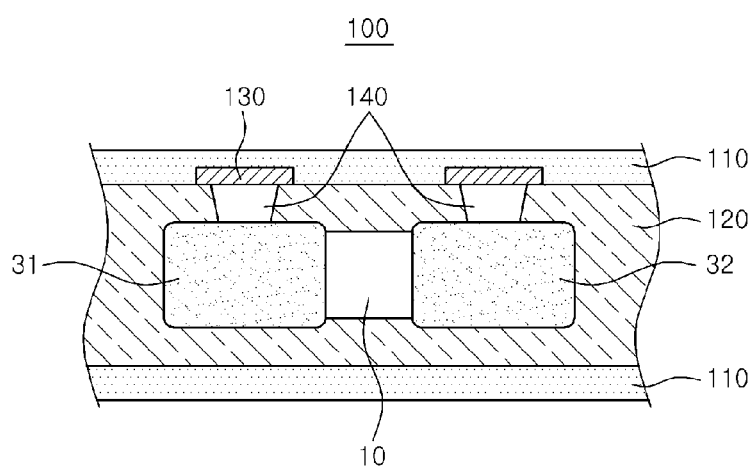
FIG. 4 is a cross-sectional view showing a printed circuit board having an embedded multilayer ceramic electronic component according to the exemplary embodiment of the present disclosure.

FIG. 4 is a cross-sectional view showing a printed circuit board having an embedded multilayer ceramic electronic component according to the exemplary embodiment of the present disclosure.

Referring to FIG. 4, the printed circuit board 100 having an embedded multilayer ceramic electronic component according to the exemplary embodiment of the present disclosure may include an insulating board 110; and an embedded multilayer ceramic electronic component including a ceramic body 10 including a dielectric layer 11 embedded in the insulating board 110 and having first and second main surfaces opposing each other, first and second side surfaces opposing each other, and first and second end surfaces opposing each other; an active layer including a plurality of first and second internal electrodes 21 and 22 formed to be alternately exposed to both end surfaces of the ceramic body 10, having the dielectric layer 11 therebetween, to thereby form capacitance; upper and lower cover layers formed on upper and lower portions of the active layer; and first and second external electrodes 31 and 32 formed on both end portions of the ceramic body 10, wherein the first external electrode 31 includes a first base electrode 31a and a first terminal electrode 31b formed on the first base electrode 31a, the second external electrode 32 includes a second base electrode 32a and a second terminal electrode 32b formed on the second base electrode 32a, the first and second external electrodes 31 and 32 are extended to the first and second main surfaces of the ceramic body 10, and when a thickness of the ceramic body 10 is defined as ts, a maximum thickness of the first and second external electrodes 31 and 32 formed on the first and second main surfaces of the ceramic body 10 is defined as tb, and a minimum distance of the first and second external electrodes 31 and 32 formed on the first and second end surfaces of the ceramic body 10 in a length direction of the ceramic body 10 is defined as ta, tb/ts and ta/tb may satisfy $0.1 \leq tb/ts \leq 1.0$ and $0.5 \leq ta/tb \leq 2.0$, respectively.

The insulating board 110 may have a structure in which an insulating layer 120 is included, and may include a conductive pattern 130 configuring an interlayer circuit in various shapes and conductive via holes 140 as shown in FIG. 4, as needed. This insulating board 110 may be a printed circuit board 100 including a multilayer ceramic electronic component therein.

The multilayer ceramic electronic component may be inserted into the printed circuit board 100 and then be equally subjected to various harsh environments during a post-processing process such as heat treatment of the printed circuit board 100.

Particularly, contraction and expansion of the printed circuit board 100 during the heat treatment process may be directly transferred to the multilayer ceramic electronic component inserted into the printed circuit board 100 to thereby apply stress to the adhesive surface between the multilayer ceramic electronic component and the printed circuit board 100.

In the case in which the stress applied to the adhesive surface between the multilayer ceramic capacitor and the printed circuit board 100 is higher than adhesive strength, delamination defects in which the adhesive surface is separated may occur.

The adhesive strength between the multilayer ceramic electronic component and the printed circuit board 100 is in proportion to electrochemical bonding strength between the multilayer ceramic electronic component and the printed circuit board 100 and an effective surface area of the adhesive surface. The delamination phenomenon between the multilayer ceramic electronic component and the printed circuit board 100 may be decreased by controlling the surface roughness of the multilayer ceramic electronic component in order to improve the effective surface area of the adhesive surface between the multilayer ceramic electronic component and the printed circuit board 100.

In addition, the generation frequency of the adhesive surface delamination from the printed circuit board 100 according to the surface roughness of the embedded multilayer ceramic electronic component for the printed circuit board 100 may be confirmed.

In addition, the multilayer ceramic electronic component having excellent reliability may be implemented by controlling the thickness of the external electrode formed on the end surface of embedded multilayer ceramic electronic component and the maximum thickness and the minimum thickness of the external electrodes formed on the upper and lower surfaces thereof.

Since other features are the same as those of the above-mentioned printed circuit board having an embedded multilayer ceramic electronic component according to the foregoing exemplary embodiment of the present disclosure, a detailed description thereof will be omitted.

As set forth above, according to exemplary embodiment of the present disclosure, the multilayer ceramic electronic component having excellent reliability may be implemented by controlling the thickness of the external electrode formed on the end surface of the embedded multilayer ceramic electronic component and the maximum thickness and the minimum thickness of the external electrodes formed on the upper and lower surfaces thereof.

In addition, according to exemplary embodiment of the present disclosure, the adhesion properties may be improved by controlling surface roughness of the plating layer, such that the delamination phenomenon between the multilayer ceramic electronic component and the board may be decreased.

While exemplary embodiments have been shown and described above, it will be apparent to those skilled in the art that modifications and variations could be made without departing from the spirit and scope of the present disclosure as defined by the appended claims.

What is claimed is:

1. An embedded multilayer ceramic electronic component comprising:
   a ceramic body including a dielectric layer and having first and second main surfaces opposing each other, first and second side surfaces opposing each other, and first and second end surfaces opposing each other;
   a plurality of first and second internal electrodes formed to be alternately exposed to both end surfaces of the ceramic body, having the dielectric layer therebetween; and
   first and second external electrodes formed on both end portions of the ceramic body,
   wherein the first external electrode includes a first base electrode and a first terminal electrode formed on the first base electrode, the second external electrode includes a second base electrode and a second terminal electrode formed on the second base electrode, the first and second external electrodes are extended to the first and second main surfaces of the ceramic body, and when a thickness of the ceramic body is defined as ts, a maximum thickness of the first and second external electrodes formed on the first and second main surfaces of the ceramic body is defined as tb, a minimum distance of the first and second external electrodes formed on the first and second end surfaces of the ceramic body in a length direction of the ceramic body is defined as ta, tb/ts and ta/tb satisfy $0.1 \leq tb/ts \leq 1.0$ and $0.5 \leq ta/tb \leq 2.0$, respectively, and
   the first and second terminal electrodes are formed of plated copper (Cu).

2. The embedded multilayer ceramic electronic component of claim 1, wherein when maximum thicknesses of the first and second external electrodes formed on the first and second main surfaces of the ceramic body are defined as tb1 and tb2, respectively, tb2/tb1 satisfy $0.8 \leq tb2/tb1 \leq 1.25$.

3. The embedded multilayer ceramic electronic component of claim 1, wherein when a minimum thickness of the first and second external electrodes formed on the first and second main surfaces of the ceramic body is defined as tc, tc/tb satisfies $0.8 \leq tc/tb \leq 1.0$.

4. The embedded multilayer ceramic electronic component of claim 1, wherein when a thickness of the first and second terminal electrodes is defined as tp, tp satisfies $tp \geq 5$ μm.

5. The embedded multilayer ceramic electronic component of claim 1, wherein when surface roughness of the first and second terminal electrodes is defined as Ra and a thickness of the first and second terminal electrodes is defined as tp, Ra satisfies $200 \text{ nm} \leq Ra \leq tp$.

6. The embedded multilayer ceramic electronic component of claim 1, wherein when the thickness of the ceramic body is defined as ts, ts satisfies $ts \leq 100$ μm.

7. A printed circuit board having an embedded multilayer ceramic electronic component, the printed circuit board comprising:
   an insulating board; and
   an embedded multilayer ceramic electronic component including a ceramic body including a dielectric layer embedded in the insulating board and having first and second main surfaces opposing each other, first and second side surfaces opposing each other, and first and second end surfaces opposing each other; a plurality of first and second internal electrodes formed to be alternately exposed to both end surfaces of the ceramic body, having the dielectric layer therebetween; and
   first and second external electrodes formed on both end portions of the ceramic body,
   wherein the first external electrode includes a first base electrode and a first terminal electrode formed on the first base electrode, the second external electrode includes a second base electrode and a second terminal electrode formed on the second base electrode, the first and second external electrodes are extended to the first and second main surfaces of the ceramic body, and when a thickness of the ceramic body is defined as ts, a maximum thickness of the first and second external electrodes formed on the first and second main surfaces of the ceramic body is defined as tb, a minimum distance of the first and second external electrodes formed on the first and second end surfaces of the ceramic body in a length direction of the ceramic body is defined as ta, tb/ts and ta/tb satisfy $0.1 \leq tb/ts \leq 1.0$ and $0.5 \leq ta/tb \leq 2.0$, respectively, and the first and second terminal electrodes are formed of plated copper (Cu).

8. The printed circuit board of claim 7, wherein when maximum thicknesses of the first and second external electrodes formed on the first and second main surfaces of the ceramic body are defined as tb1 and tb2, respectively, tb2/tb1 satisfy $0.8 \leq tb2/tb1 \leq 1.25$.

9. The printed circuit board of claim 7, wherein when a minimum thickness of the first and second external electrodes formed on the first and second main surfaces of the ceramic body is defined as tc, tc/tb satisfies $0.8 \leq tc/tb \leq 1.0$.

10. The printed circuit board of claim 7, wherein when a thickness of the first and second terminal electrodes is defined as tp, tp satisfies $tp \geq 5$ μm.

11. The printed circuit board of claim 7, wherein when a surface roughness of the first and second terminal electrodes is defined as Ra and a thickness of the first and second terminal electrodes is defined as tp, Ra satisfies $200$ nm $\leq Ra \leq tp$.

12. The printed circuit board of claim 7, wherein when the thickness of the ceramic body is defined as ts, ts satisfies $ts \leq 100$ μm.

13. The embedded multilayer ceramic electronic component of claim 1, wherein the first and second terminal electrodes consist of plated copper (Cu).

14. The printed circuit board of claim 7, wherein the first and second terminal electrodes consist of plated copper (Cu).

* * * * *